United States Patent [19]

Moore et al.

[11] Patent Number: 5,133,604
[45] Date of Patent: Jul. 28, 1992

[54] METHOD AND APPARATUS FOR EVALUATING EVAPORATING BOATS BASED ON EVAPORATION RATE CHARACTERISTICS

[75] Inventors: Denis Moore, Rollinsford; Vincent Yedlin Jr., Manchester, both of N.H.

[73] Assignee: Davidson Textron Inc., Dover, N.H.

[21] Appl. No.: 737,686

[22] Filed: Jul. 30, 1991

[51] Int. Cl.$^5$ .................................. G01N 25/00
[52] U.S. Cl. ............................... 374/54; 374/45
[58] Field of Search .......................... 374/45, 54

[56] References Cited

U.S. PATENT DOCUMENTS

| | | | |
|---|---|---|---|
| 3,050,981 | 8/1962 | Schwarz | 374/54 |
| 3,928,244 | 12/1975 | Passmore | 252/520 |
| 3,939,698 | 2/1976 | De Lacy | 374/45 |
| 4,528,120 | 7/1985 | Hunold et al. | 252/520 |
| 5,002,399 | 3/1991 | Akinc et al. | 374/54 |

*Primary Examiner*—Allan N. Shoap
*Assistant Examiner*—Diego F. F. Gutierrez
*Attorney, Agent, or Firm*—Reising, Ethington, Barnard, Perry & Milton

[57] ABSTRACT

Evaporation boats utilized in the vacuum metalizing process are categorized based on evaporation characteristics thereof to match similar boats for the metalizing process. Power is supplied to the evaluation boat and the period of time required for the evaluation boat to reach a predetermined temperature is monitored. This period of time is indicative of the evaporation rate of the boat during the metalizing process and is used to categorize and match boats as super slow, slow or fast.

10 Claims, 1 Drawing Sheet

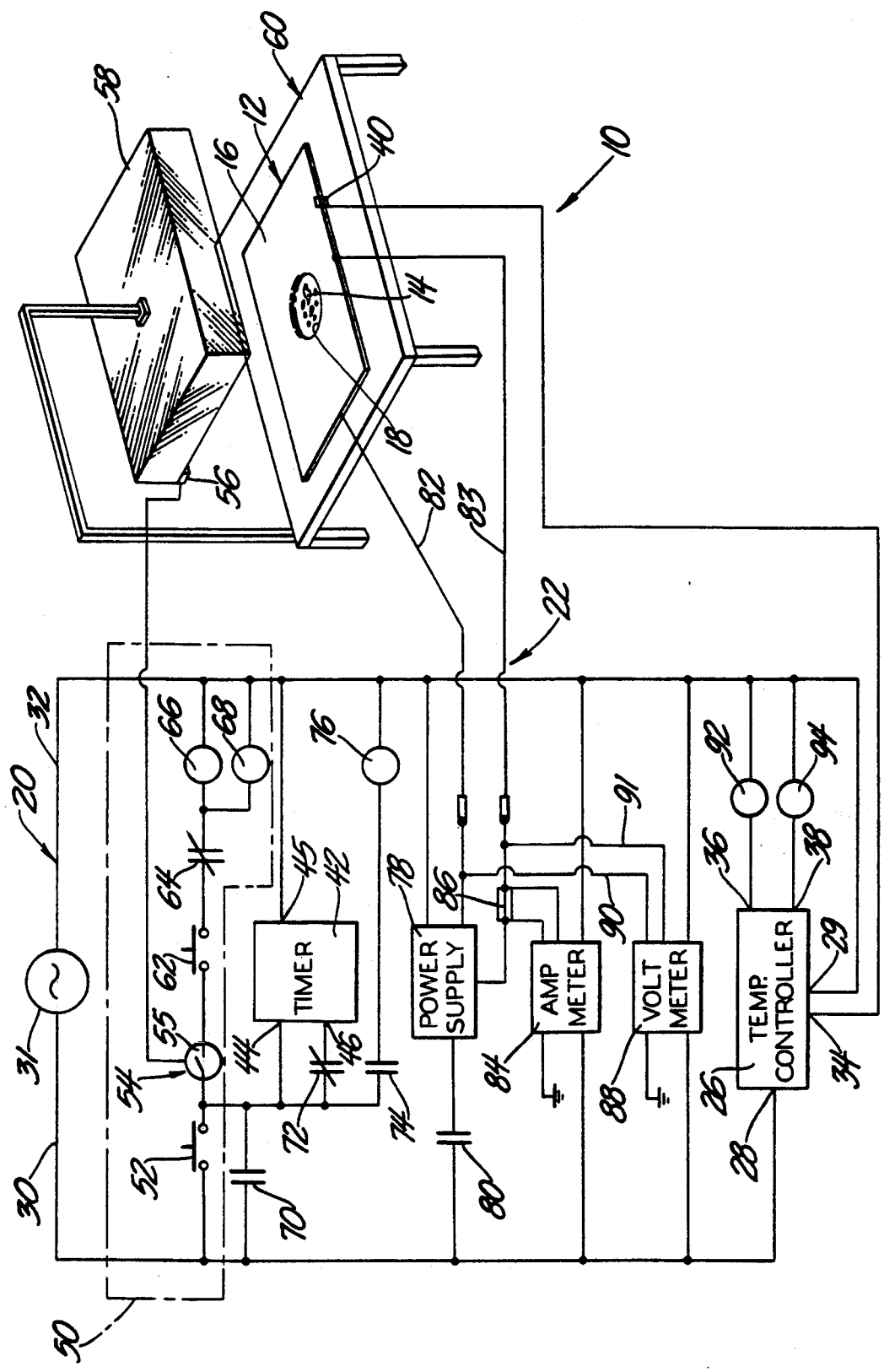

5,133,604

METHOD AND APPARATUS FOR EVALUATING EVAPORATING BOATS BASED ON EVAPORATION RATE CHARACTERISTICS

TECHNICAL FIELD

The invention relates to evaporation boats utilized in a vacuum metalizing process, and more particularly to the testing of the evaporation boats to determine evaporation characteristics thereof.

BACKGROUND OF THE INVENTION

Vacuum metalizing of plastic and similar dielectric substrates has been practiced for some time. The automobile industry has used metalized trim components that could be substituted for conventional chrome-plated metal parts. The stages of metal film growth by vacuum deposition proceeds from metal nucleation and nuclei growth, liquid coalescence, to electrically discrete islands, channelization with incipient film conductivity and finally full continuous film formation. U.S. Pat. No. 4,431,711, issued Feb. 14, 1984 in the name of Eisfeller, assigned to the assignee of the subject application, discloses one method of vacuum metalizing a dielectric substrate with indium and products thereof. The patent relates to an article of manufacture comprising an organic dielectric base or substrate having a smooth surface such as a molded plastic. A macroscopically continuous-appearing very thin layer thereon of a vacuum deposited corrosion-prone metal, specifically indium and alloys thereof is deposited on the smooth surface. The metal is in the form of minute specular electrically discrete rounded metal islands. There is a top coating over the metal film of an intimately adhered clear dielectric resin film encapsulating and protecting the metal particles, and binding them firmly to the substrate. The product is particularly useful in automotive applications such as an automobile exterior trim component to replace heavier and more expensive conventional chrome-plated metal parts.

During the vacuum metalizing process, a vacuum chamber encompasses the dielectric substrate to be coated along with evaporator boats having metal material thereon, which material is vaporized and attracted to the substrate. Due to the unique operating characteristics of the vacuum metalizing process, it has been determined that matched evaporation boats, i.e., having similar evaporation rate or heating rates, provide for a better part quality and a better first run capability. In general, a plurality of evaporation boats are connected in parallel or series to the power source during evaporation of the metal material. It is important to that evaporation boats have similar evaporation characteristics to ensure an even, uniform layer of metal on the substrate during the evaporation process. When unmatched boats are utilized, some of the boats have evaporation rates different from other boats and therefore an uneven coating may occur on the substrate due to the different rates of metal evaporation. Because of the unique system in which the tungsten boats are used, there is no method to determine which boat is providing more or less evaporated metal material to the vacuum metalizing process.

SUMMARY OF THE INVENTION

The invention relates to an evaluation apparatus and method for testing evaporation boats utilized to hold a metal material for use in a vacuum metalizing process in order to allow categorization of the boats based on pre-tested evaporation rate characteristics. The method is supported by the apparatus, and comprises measuring means for measuring a characteristic of the evaporation boat indicative of evaporation rate by the boat during the vacuum metalizing process, and connecting means for connecting the evaporation boat to the measuring means.

The invention further includes means for sensing the temperature of the evaporation boat and for producing a temperature signal when the boat reaches a first predetermined temperature. Timing means receives the temperature signal and visually produces a time indicative of the rate for the temperature of the evaporation boat to reach the first predetermined temperature. The rate is used to categorize the evaporation boat as super slow, slow and fast.

FIGURES IN THE DRAWINGS

Advantages of the present invention will be readily appreciated as the same becomes better understood by reference to the following detailed description when considered in connection with the accompanying drawings wherein:

FIG. 1 is a schematic diagram of the subject invention.

DESCRIPTION OF THE PREFERRED EMBODIMENT

An evaluation apparatus for testing evaporation boats 12 utilized to hold a metal material 14 for use in the vacuum metalizing process is generally indicated at 10 in FIG. 1. The evaluation apparatus 10 allows persons to categorize the boats 12 as super slow, slow or fast based on tested evaporation rate characteristics. It is to be understood that the evaporation boats 12 may be categorized in any number of categories.

Evaporation boats 12 are generally made of tungsten, or other suitable temperature stable, electrically resistant material. The evaporation boat 12 generally comprises a flat, stamped, three fourth inch by three inch metal sheet 16 having a dimple 18 therein in which the metal 14 to be evaporated is placed during the vacuum metalizing process. The evaporation rate of the metal must be controlled to predetermined limits as known in the metalizing process to ensure proper coating of the substrate. If the evaporation is too fast, a uniform coat will not be adhered to the substrate and a haze occurs. The evaporation boats 12 may be categorized and matched as super slow, slow or fast rate. The evaluation apparatus 10 provides the information to categorize placing each tested evaporation boat 12 into one of the three categories. It is to be understood that the evaporation boat may be categorized differently depending upon the resolution desired between individual ones of the evaporation boats use in the vacuum metalizing process.

The evaporation apparatus 10 includes measuring means 20 for measuring a characteristic of the evaporation boat 12 indicative of evaporation rate by the boat 12 during the vacuum metalizing process. The measuring means 20 is connected to the evaporation boat 12 by connecting means 22 for supplying current from the measuring means 20 to the evaporation boat 12 for heating the same. The characteristic to be measured as indicative of the evaporation rate of the metal material is the heating rate of the evaporation boat 12. Based upon this measured characteristic, e.g., heating rate, the evaporation boat 12 is categorized.

The measuring means 20 includes temperature means 24 for sensing the temperature of the evaporation boat, for producing a temperature signal indicative when the evaporation boat 12 reaches a first predetermined temperature, and for producing an override signal when the evaporation boat 12 reaches a second predetermined temperature. The temperature means 24 includes a temperature controller 26 of known as a Athena 6000 microprocessor-based temperature controller manufactured by Athena Controls Inc. The temperature controller 26 includes two power inputs 28, 29 supplied power by the ac power lines 30, 32, which are connected to an ac power supply. The temperature controller 26 also includes an input 34 for receiving the temperature of the evaporation boat 12. The temperature controller 26 also includes a set output 36 for producing the temperature signal upon reaching the first predetermined temperature and an override output 38 for producing the override signal upon sensing the second predetermined temperature or over temperature by the temperature controller 26. The temperature means 24 also includes a thermocouple 40 for connection to the evaporation boat 12 to sense and transmit the temperature of the evaporation boat 12. The thermocouple 40 may be of any type as commonly known in the art.

The measuring means 20 includes timing means 42 for receiving the temperature signal and visually producing a time indicative of the rate for the temperature of the evaporation boat 12 to reach the first predetermined temperature. The timing means 42 comprises a timer of the type Shawnee II Series ATC 355 manufactured by Shawnee, Inc. The timer 42 includes first and second power inputs 44, 45; a trigger input 46 for starting the timer 42 upon supplying a power and for stopping the timer 42 in response to the temperature signal and a four digit display.

The measuring means 20 also includes control means 50 responsive to manual actuation for supplying and discontinuing power to the evaporation boat 12 and for initiating the timer 42. The control means 50 includes a start push button 52 connected to the first power line 30 for allowing power to be supplied therethrough to a capacitive proximity sensor 54. The start push button 52 is a normally open momentary switch. The proximity sensor 54 includes a switch 55 and detector 56 operatively connected to one another, as commonly known in the art. The detector 56 is clamped onto the plexiglass housing 58 of the test fixture 60. The proximity switch 55 is in the closed position upon closure of the plexiglass housing 58. When the capacitive proximity sensor 54 is opened upon opening of the plexiglass housing 58, power is discontinued therethrough by opening of the switch 55. Also included is a reset switch 62 which is in the normally closed position. Manual actuation of the reset switch 62 momentarily opens its contact discontinuing power therethrough. An override switch 64 is a normally closed contact switch connected to the reset switch 62 for receiving power therefrom. The override switch 64 is connected to a parallel power relay 66 and a test indicator 68 to the second power line 32.

A first power switch 70 is connected between the first power line 30 and the proximity sensor 54, and is connected to the timer 42. The first power switch 70 is normally open, and closes in response to powering of the power relay 66. A first temperature switch 72 is connected between the trigger input 46 of the timer 42 and the first power line 30. The first temperature switch 72 is a normally closed contact switch. Also included is a second temperature switch 74 connected through a timed out indicator light 76 to the second power line 32.

The measuring means 20 includes heating means 78 for receiving power and supplying current to the evaporation boat 12 for heating thereof. The heating means 78 is a regulated power supply, as commonly known in the art, for supplying 50 amperes through the evaporation boat 12. The heating means 78 is connected through a second power switch 80 to the first power line 30, and is directly connected to the second power line 32. The second power switch 80 is a normally open contact switch, and closes in response to powering of the power relay 66. The connecting means 22 comprises two leads 82, 83 connected between the heating means 78 and the evaporation boat 12.

The measuring means 20 also includes current monitoring means 84 for monitoring the current through the evaporation boat 12. The current monitoring means 84 includes an ampere meter operating from zero to 100 amps and which is connected between the first power line 30 and second power line 32. Ampere meters 84 are commonly known in the art. The ampere meter 84 includes a shunt connection 86 connected to the connection lead 83.

The measuring means 20 also includes a volt meter 88 for sensing the voltage across the evaluation boat 12. The volt meter 88 may be of any common type capable of sensing 0-2 V with millivolt resolution. The volt meter 88 is connected between the two power lines 30, 32 and has sensing power leads 90, 91 connected to each of the connection leads 82, 83 for sensing voltage applied across the evaluation boat 12.

The measuring means 20 also includes a temperature relay 92 for receiving the temperature signal and opening the first temperature switch 72 and closing the second temperature switch 74. An override relay 94 receives the override signal and powers to open the override switch 64.

By way of operation, the start momentary switch 52 is first momentarily depressed to supply power to the capacitive proximity sensor 54. Assuming that the capacitive proximity sensor 54 is closed in response to closure of the plexiglass housing 58, power is sent therethrough to the reset switch 62 to the normally closed override switch 64. If the plexiglass housing 58 is open, the proximity sensor 54 is open to de-energize the apparatus 10. The power relay 66 receives the power through the override switch 64 and charges to close the power switches 70, 80 to initiate the timer 42 and to power the heating means 78. The test indicator 68, generally an LED, is also illuminated. Upon the first power switch 70 closing, power is supplied to the timer 42 and through switch 72 to initiate the timing cycle. The heating means 78 supplies current to the evaluation boat 12 while the amperage meter 84 and volt meter 88 monitor the ampere and voltage applied to the evaluation boat 12. The temperature controller 26 monitors the temperature of the evaluation boat 12 by the thermocouple 40. Upon the temperature controller 26 sensing the temperature of the evaluation boat 12 at the first predetermined temperature, the temperature signal is produced to the temperature relay 92 which in turn opens the first temperature switch 72 to stop the timer 42 and closes the second temperature switch 74. The timed out indicator light 76, generally an LED, is illuminated and the four digit display of timer 42 displays rate of time for the evaluation boat 12 to reach the first predetermined temperature. Upon the temperature controller 26 sensing the second predetermined temperature, the override relay 94 is powered to open the override switch 64 discontinuing power to the power relay 66, which in turn opens the power switches 70, 80 discontinuing power to the apparatus 10. The reset switch 62 may be depressed at any time to discontinue power to the power relay 66 which in turn opens the power switches 74, 80 de-energizing both the timer 42 and the heating means 78.

The evaluation boat 12 is categorized as super slow, slow or fast depending on the timer display. If the timer 42 reads approximately 25 seconds, the boat 12 is characterized as slow. If the time is 12-13 seconds, the boat 12 is characterized as fast. A super slow boat 12 is less than these times. The current and voltage at the evaluation boat 12 may also be used to categorize the boats 12.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims wherein reference numerals are merely for convenience and are not to be in any way limiting, the invention may be practiced otherwise than as specifically described.

What is claimed is:

1. An apparatus for testing evaporation boats utilized to hold a metal material for use in a vacuum metalizing process in order to allow categorization of the boats based on evaporation rate characteristics, said apparatus comprising:
   measuring means for measuring a characteristic of the evaporation boat indicative of evaporation rate by the boat during the vacuum metalizing process;
   connecting means for connecting the evaporation boat to said measuring means;
   said measuring means including control means for supplying and discontinuing power to the evaporation boat to heat the evaporation boat to a first predetermined temperature and temperature means for sensing the temperature of the evaporation boat and for producing a temperature signal when the evaporation boat reaches said first predetermined temperature, and timing means responsive to said control means for receiving said temperature signal and for visually producing a time indicative of the period of time between the supply of power by said control means to said evaporation boat and the heating thereof to said first predetermined temperature which is also indicative of the evaporation rate of the boat during the metalizing process.

2. An apparatus as set forth in claim 1 wherein said measuring means includes heating means responsive to said manual actuation means for receiving power and supplying current to the evaporation boat.

3. An apparatus as set forth in claim 2 wherein said measuring means includes override means responsive to said temperature means for electronically discontinuing power to said timing means and the evaporation boat.

4. A method for testing evaporation boats utilized to hold a metal material for use in a vacuum metalizing process to allow categorization of the boats based on evaporation rate characteristics, the method including the steps of;
   supplying power to the evaporation boat to heat the evaporation boat,
   measuring the temperature of the evaporation boat during the supply of power thereto,
   measuring the time period between the supply of power and the heating of the evaporation boat to a first predetermined temperature,
   indicating the time period,
   categorizing the evaporation boat based on the time period as one of slow or fast evaporation in the metalizing process.

5. A method as set forth in claim 4 further including producing an override signal when the evaporation boat reaches a second predetermined temperature.

6. A method as set forth in claim 5 further including visually producing the time period required for the temperature of the evaporation boat to reach the first predetermined temperature.

7. A method as set forth in claim 6 further including supplying and discontinuing power in response to manual actuation to determine the time period.

8. A method as set forth in claim 7 further including electronically discontinuing the power in response to the override signal.

9. A method for testing evaporation boats utilized to hold a metal material for use in a vacuum metalizing process to allow categorization of the boats based on evaporation rate characteristics, said apparatus comprising:
   measuring means for measuring a characteristic of the evaporation boat indicative of evaporation rate by the boat during the vacuum metalizing process;
   connecting means for connecting the evaporation boat to said measuring means;
   said measuring means including temperature means for sensing the temperature of the evaporation boat and for producing a temperature signal when the evaporation boat reaches a first predetermined temperature and for producing an override signal when the evaporation boat reaches a second predetermined temperature.

10. An apparatus for testing evaporation boats utilized to hold a metal material for use in a vacuum metalizing process in order to allow categorization of the boats based on evaporation rate characteristics, said apparatus comprising:
    measuring means for measuring a characteristic of the evaporation boat indicative of evaporation rate by the boat during the vacuum metalizing process;
    connecting means for connecting the evaporation boat to said measuring means;
    said measuring means including control means for supplying and discontinuing power to the evaporation boat to heat the evaporation boat and for producing an initiation signal;
    temperature means for sensing the temperature of the evaporation boat and for producing a temperature signal when the evaporation boat reaches a first predetermined temperature; and
    timing means for receiving said initiation signal to initiate a time period and for receiving said temperature signal to determine the time period from initiation until heating of the evaporation boat to said first predetermined temperature, said time period being indicative of the evaporation rate of the boat during the metalizing process.

* * * * *